United States Patent [19]

Rao

[11] 4,055,444
[45] Oct. 25, 1977

[54] METHOD OF MAKING N-CHANNEL MOS INTEGRATED CIRCUITS

[75] Inventor: G. R. Mohan Rao, Houston, Tex.

[73] Assignee: Texas Instruments Incorporated, Dallas, Tex.

[21] Appl. No.: 648,593

[22] Filed: Jan. 12, 1976

[51] Int. Cl.² .......................................... H01L 21/26
[52] U.S. Cl. .................................... 148/1.5; 148/187
[58] Field of Search ................................ 148/1.5, 187

[56] References Cited

U.S. PATENT DOCUMENTS

| 3,508,126 | 4/1970 | Newman et al. | 148/187 X |
| 3,717,790 | 2/1973 | Dalton et al. | 148/1.5 |
| 3,745,070 | 7/1973 | Yada et al. | 148/1.5 |
| 3,771,218 | 11/1973 | Langdon | 148/187 X |
| 3,793,088 | 2/1974 | Eckton, Jr. | 148/1.5 |
| 3,880,676 | 4/1975 | Douglas et al. | 148/1.5 |

*Primary Examiner*—G. Ozaki
*Attorney, Agent, or Firm*—John G. Graham

[57] ABSTRACT

An improved method of making N-channel, silicon gate, MOS integrated circuits such as used for memories is disclosed. Structural damage to the crystalline silicon such as caused by an ion implant process is reduced by a high temperature treatment in an inert atmosphere followed by oxidation. This treatment also alters the concentration profile of the implanted impurity to provide improved device characteristics.

9 Claims, 10 Drawing Figures

4,055,444

METHOD OF MAKING N-CHANNEL MOS INTEGRATED CIRCUITS

BACKGROUND OF THE INVENTION

This invention relates to improved methods of making semiconductor devices, and more particularly to a heat treatment step to be used in a method of making N-channel MOS integrated circuits which employs ion implant techniques.

MOS memory devices, particularly random access memories or RAM's, are being used for much of the storage in computers of all types. One of the most widely manufactured semiconductor devices at present is the N-channel, silicon-gate, MOS dynamic RAM, typically in 1K or 4K (1024 or 4096) bit size. These devices are described by Stein et al in IEEE Journal of Solid State Devices, Vol. SC-7, No. 5, Oct. 1972, and in U.S. Pat No. 3,909,631, issued Sept. 30, 1975 to N. Kitagawa, as well as in Electronics magazine, Sept. 13, 1973, p. 116–121.

One of the steps typically used in the manufacture of these devices is the formation of a shallow P+ type region over some of the surface of the silicon slice for the purpose of preventing unwanted or parasitic MOS devices from existing. This region is referred to as the channel stop. Ordinarily it is formed by a boron implant, i.e., by implanting boron atoms using an ion beam. The effect of implantation on the crystalline structure of silicon is described by Prussin and Fern in Journal of Electrochemical Society, Vol. 122, No. 6, June, 1975.

It has been determined that the damage to the crystalline structure and the impurity concentration profile resulting from the ion implant process have caused undesirable characteristics in memory devices. For example, the refresh time, or the time period between necessary refresh cycles in operation of the memory system, is a function of temperature. As temperature increases, the tendency for the charge stored in an oxide-dielectric MOS capacitor in conjunction with the depletion and inversion layers underneath, as used for storang cells in these devices, to leak off, also increases. The devices are advertised and sold with certain temperature specifications, i.e., they should be operable over the range from 0° to 70° C, ambient temperature, for example. The devices are often used in systems which have a clock cycle or machine cycle of about 400 ns; in this context, the time between refresh cycles should not be less than about 2 milliseconds. The system must be designed to read out all the data in memory and write it back in to "refresh" it at certain intervals, but this is unproductive overhead on the system and must be minimized. Once every several thousand machine cycles is acceptable, but the system is designed around a certain specified refresh time, and devices not meeting this specification at higher temperatures are not acceptable.

Another effect of the boron implant technique is that the unwanted capacitance between some elements of the semiconductor structure and the substrate is unduly high. This causes the maximum operating speed of the devices to be lower than desired. The capacitance of a reverse biased P-N junction is dependent upon the width of the depletion region, and for a given voltage across the junction the depletion region extends for a distance dependent upon impurity concentration and its profile. Lowering impurity concentration reduces capacitance, which is desirable in this case. The impurity profile resulting from the process of this invention has a favorable effect on parasitic capacitance and thus speed.

It is the primary object of this invention to provide an improved method of making semiconductor devices, particularly N-channel, silicon-gate MOS devices. Another object is to increase the "refresh time" characteristics of MOS memory devices at high temperatures. A further object is to reduce leakage associated with ion implantation in semiconductor devices which have been subjected to ion implant. Another object is to provide MOS memory devices which operate at higher speeds.

BRIEF SUMMARY OF THE INVENTION

An ion implant step is used in the manufacturing process for N-channel, silicon-gate devices at a particular stage where the field-oxidation mask is in place but the oxidation step has not been accomplished; this mask is usually nitride. During the high temperature field-oxidation, damage to the crystalline structure of the silicon propagates into the silicon ahead of the oxidation front, so it will exist in the finished device. The damage caused by ion implantation is proportional to the amount of implanted dose; more damage resulting from higher dose. As such, this invention suggests using only an adequate amount of dosage for channel stop, to obtain acceptable electrical characteristics yet keeping the damage to a minimum. According to the invention, the damage is cured by a separate heat treatment after implant but prior to field-oxidation, at a temperature higher than oxidation and in an inert atmosphere. This treatment also favorably changes the impurity distribution profile.

THE DRAWINGS

The novel features believed characteristic of the invention are set forth in the appended claims. The invention itself, however, as well as other features and advantages thereof, will best be understood by reference to the following detailed description of a particular embodiment, when read in conjunction with the accompanying drawings, wherein:

DETAILED DESCRIPTION OF SPECIFIC EMBODIMENT

Figure 1A:
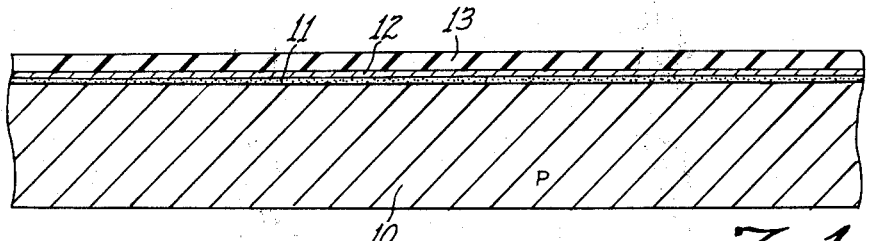
FIGS. 1a–1e are elevation views in section of a small part of a semiconductor slice during successive stages of manufacture, according to the invention.
Figure 1B:
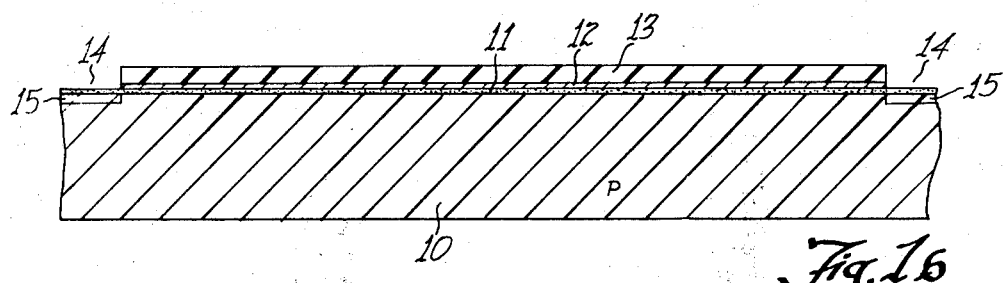
Figure 1C:
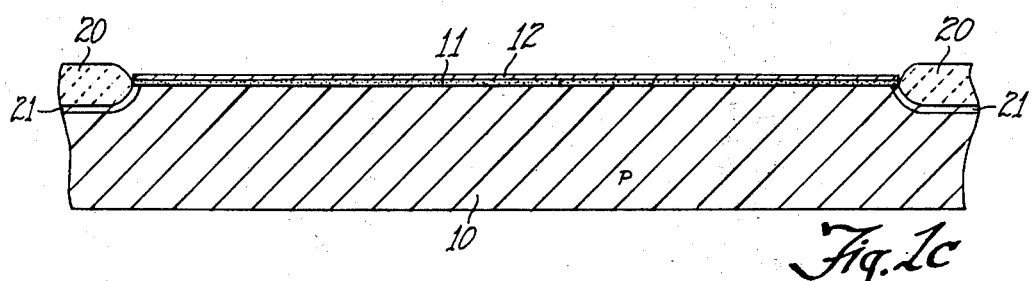
Figure 1D:
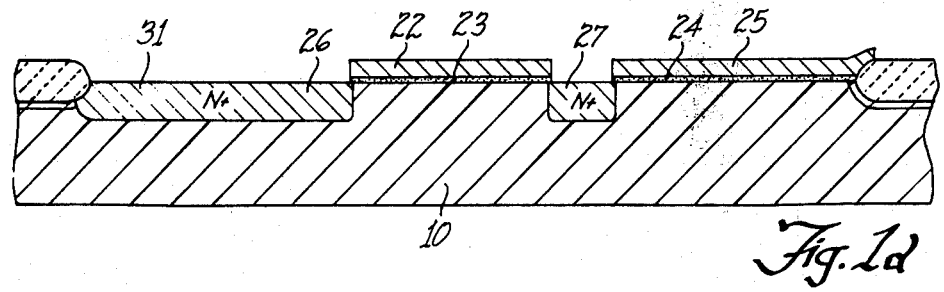

Referring to FIGS. 1a–1e, a process for making N-channel, silicon-gate, self aligned MOS integrated circuits will be described. The starting material is a slice of P-type monocrystalline silicon, perhaps 3 inches in diameter and 20 mils thick, cut on the <100> plane, of a resistivity of about 12 to 15 ohm-cm. In FIG. 1a, a wafer or body 10 represents a very small part of the slice, chosen as a representative sample. First, after appropriate cleaning, the slice is oxidized by exposing to oxygen in a furnace at an elevated temperature of perhaps 1000° C to produce an oxide layer 11 of a thickness of about 1000A. Next, a layer of 12 of silicon nitride is formed by exposing to an atmosphere of silane and ammonia in an rf plasma reactor as shown in FIG. 2 of U.S. Pat No. 3,907,616. Techniques for depositing nitride layers are also shown in British Pat No. 1,104,935 and by Sterling & Swann, Solid State Electronics, Vol. 8, p. 653–54, 1965. This layer 12 is grown to a thickness of about 1000A. A coating 13 of photoresist is applied to the top surface, exposed to ultraviolet light through a mask which defines the desired pattern, and developed. This leaves areas 14 where nitride is to be etched away. The slice is subjected to a nitride etchant, which removes the exposed part of the nitride layer 12 but does not remove the oxide layer 11 and does not react with the photoresist 13, producing the structure seen in FIG. 1b.

The slice is now subjected to an ion implant step, whereby boron atoms are implanted in the areas of silicon not covered by photoresist 13 and nitride 12. The photoresist could have been removed, but preferably is left in place as it masks the implant. Boron is an impurity which produces P-type conductivity, so a more heavily doped P+ region 15 will be produced in the surface. The impurity profile at this point will be as seen in FIG. 2, where it is seen that a curve 16 shows the concentration of boron as a function of depth. This curve 16 has a peak at about 2000A, from which it falls off rapidly in both directions. It is important that the oxide layer 11 be left in place during the implant because it prevents the implanted boron atoms from out diffusing from the surface during subsequent heat treatment. Redistribution accounts for the fact that the curve 16 shows the concentration to be lower in the region from the surface to 1000A than at 2000A. The boron implant is at a dosage of about $8 \times 10^{12}/cm^2$ at 100 KeV prior to this invention. This produces a shallow region 15 of high concentration. This invention suggests using an implant dose of $4 \times 10^{12}/cm^2$ at 100Kev compared to about $8 \times 10^{12}$ as in use.

In a prior method used for manufacturing N-channel silicon gate integrated circuits, the next step in the process would have been to subject the slice to a high temperature oxidation procedure, just as will be described below to produce the thick field oxide. However, it has been found that the boron implant operation produces damage to the crystal structure at the surface, in the region 15, and that this damage is propogated into the underlying material during field oxidation. As will be seen, the region 15 does not exist in the same form in the finished device, because some of this part of the slice will have been consumed in the oxidation procedure. Thus, it is not apparent that the damage caused by implant would be a problem. Analysis and experimentation show that leakage contribution due to this effect will cause the refresh time of memory cells manufactured by the prior process to be unacceptable at the upper end of the temperature range of usage, i.e., above about 70° C ambient.

The next step in the process of this invention is to subject the slices to a heat treatment or annealling step, during which the slices are maintained at a temperature of about 1000° C for perhaps approximately 100 minutes in an inert atmosphere, preferably nitrogen. The time period may be as short as about 30 minutes, and may extend to 2 hours. The temperature should be above the oxidation temperature, 900° C, and below about 1200° C. This step causes the boron concentration to change markedly, which has desirable effects aside from the reduction in bulk damage in the crystal structure. The concentration after annealling is shown by a curve 18 in FIG. 2. The P+ region has now penetrated much deeper into the silicon surface.

The next step in the process is formation of field oxide, which is done by subjecting the slices to steam or an oxidizing atmosphere at about 900° C. for perhaps 10 hours. This causes a thick field oxide region or layer 20 to be grown, and this region extends into the silicon surface because silicon is consumed as it oxidizes. The nitride layer 12 masks oxidation beneath it. The thickness of this layer 20 is about 10,000A, half above the original surface and half below. The boron doped P+ region 15 formed by the implant and modified by the anneal step will be partly consumed, but will also diffuse further into the silicon ahead of the oxidation front. Thus, a P+ region 21 will result which will be deeper and of more uniform and acceptable concentration at the surface compared to what would have resulted without the anneal step of the invention. Also, the region 21 will not have the extent of crystalline structure damage characteristic of implanted devices.

The nitride layer 12 and its underlying oxide layer 11 are removed by etching, as the next step, and another thin oxide layer of about 950A is grown over the exposed areas of silicon. Windows for polysilicon to silicon contacts are patterned and etched. A layer of polycrystalline silicon is deposited in a reactor using standard techniques. The polysilicon and gate oxide or thin oxide layers are next patterned by applying a layer of photoresist, exposing to ultraviolet light through a mask prepared for this purpose, developing, then etching with the remaining photoresist masking certain areas of the polysilicon. The resulting structure is seen in FIG. 1d, where a part of the remaining polysilicon layer provides what will be the gate 22 of an MOS transistor, and thin oxide underneath it is the oxide 23 of the transistor. These same layers also provide a capacitor, wherein the thin oxide is the dielectric layer 24 and the polysilicon layer, acting merely as a conductor, is one plate 25 of the capacitor.

Using the polysilicon and oxide 23, 24 as a diffusion mask, the slice is now subjected to an N+ diffusion, whereby phosphorus is diffused into the silicon slice 10 to produce regions 26 and 27. The depth of diffusion is about 8,000 to 10,000A. The region 26 functions as a conductor which connects to all transistors in a column in a memory array, and also functions as the source (or drain) region of the MOS transistor. The region 27 functions as the drain (or source) of the MOS transistor, and as a connection to the lower plate of the capacitor beneath the polysilicon area 25.

Figure 1E:
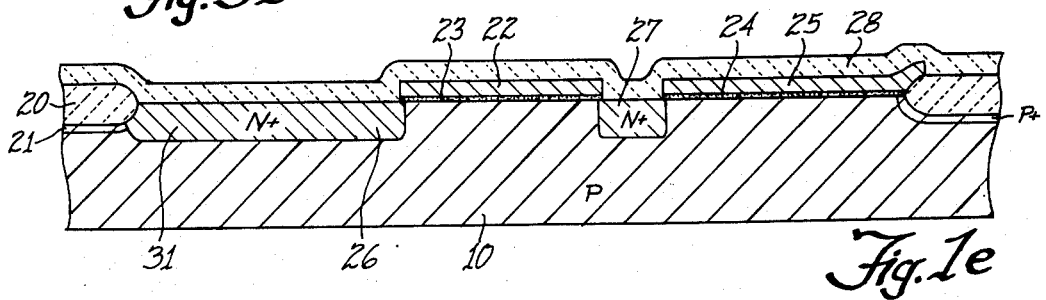
Figure 2:
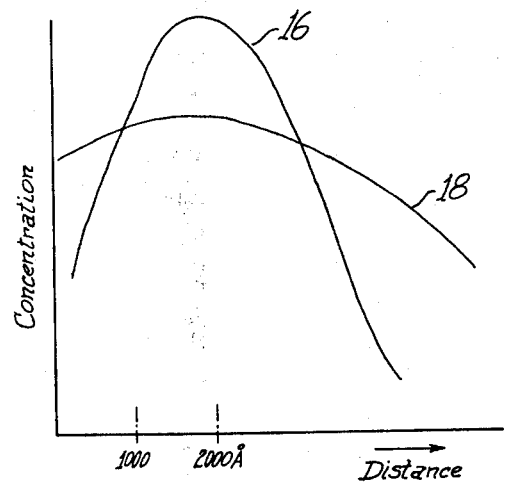
FIG. 2 is a graphic representation of impurity concentration vs. depth for a part of the silicon slice of FIGS. 1c and 1d.

As seen in FIG. 1e, fabrication of the device is continued by depositing another layer 28 of field oxide. This is done by a low temperature reaction process, rather than by oxidizing, using conventional chemical vapor deposition techniques. A layer 28 of about 10,000A is produced, covering the entire slice. Subsequently, windows are opened in the oxide layer 28 in places where contact is to be made to regions of the silicon or to the polysilicon layer such as to the gate 22, using photoresist masking and etching. Then, a layer of aluminum is deposited on the entire slice, and etched away using photoresist masking to provide the desired pattern of metal interconnections.

Figure 3:
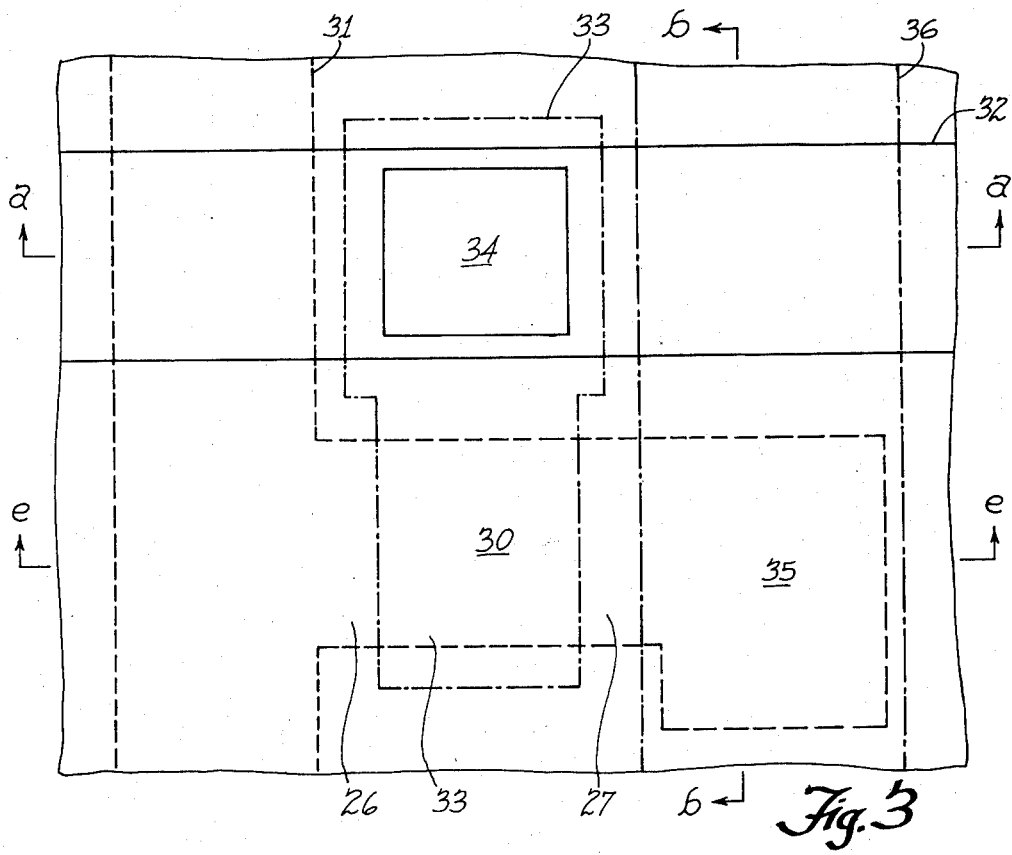
FIG. 3 is a plan view of a memory cell made according to the invention.
Figure 5A:
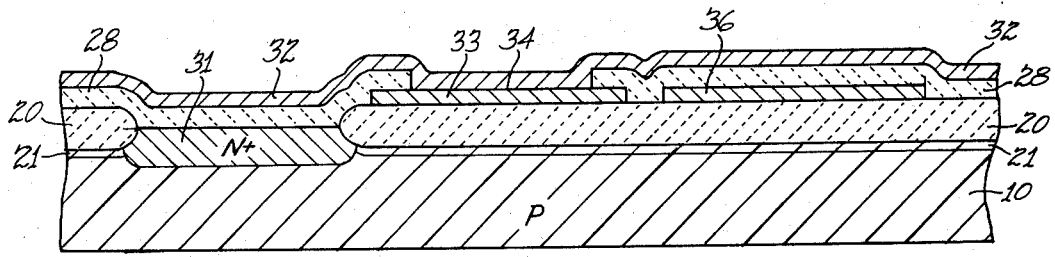
FIG. 5a is a sectional view of the device of FIG. 3, taken along the line a—a in FIG. 3.
Figure 5B:
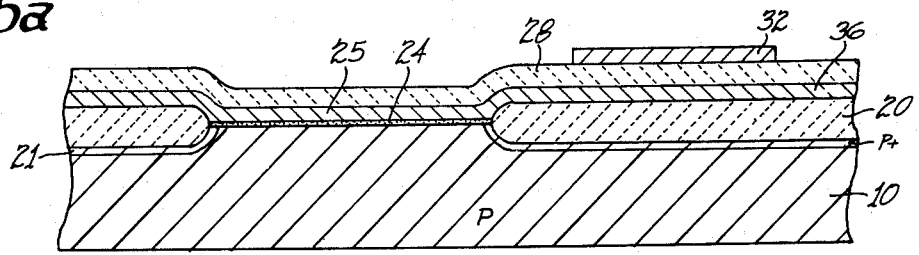
FIG. 5b is a sectional view of the device of FIG. 3, taken along the line b—b in FIG. 3.
Figure 4:
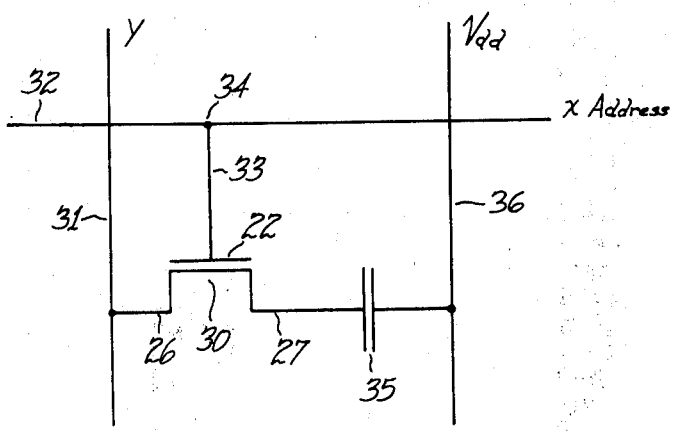
FIG. 4 is an electrical schematic diagram of the memory cell of FIG. 3.

Referring to FIG. 3, a top view of a memory cell made according to the invention is illustrated. The cell is one of many that would be formed on a semiconductor chip. For example, 4096 such cells, along with addressing, refresh and input/output buffer circuitry, would be formed on a chip which is about 160 mils on a side. Thus, the space occupied by the cell of FIG. 3 is not more than about 1½ square mils, so the width of the cell from side to side is not over about 1 mil or 0.001 inch. The cell includes an MOS transistor 30 which has a polycrystalline silicon gate region 22 as discussed above, as well as a source region 26 of N+ diffused silicon and a drain region 27. The source 26 is part of the N+ diffused region which creates a sense line 31 which is the column or Y line. The row line is an aluminum strip 32 which is connected to an underlying part 33 of the polysilicon layer at a contact area 34 so that connection to the gate 22 is provided. The line 32 would be connected to all of the gates in a row of 64 like cells. The storage capacitance 35 is formed by the polysilicon layer 25 which is part of a continuous strip 36 of polysilicon that is connected to a voltage such as Vdd source at one end. Thus, the top plate of each storage capacitor has a large positive voltage on it, and this creates a depletion region beneath the thin oxide 24 and the polysilicon 25. This depletion region, in effect inverted to N-type, functions as the lower plate of the capacitor. The circuit of this storage cell is seen in FIG. 4, where the same parts are labeled with the same reference numerals. Likewise, FIGS. 5a and 5b show the device in section, where the same reference numbers are used for like parts. FIG. 1e is a section view of FIG. 3 along the line e—e.

It is noted that the P+ channel stop region 21 will surround the sense line 31 on both sides and along its entire length as well as the periphery of the storage capacitors. The capacitance of the sense line should be as low as possible, because the ratio of the capacitance of the sense line to the capacitance of the storage capacitor 35 defines how large the signal will be at the sense line output. It has been found that this capacitance is decreased in a device made according to this invention because the concentration profile is improved, as discussed above.

While this invention has been described with reference to an illustrative embodiment, it is not intended that this description be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making N-channel, silicon-gate MOS integrated circuit devices of the type having memory cells therein, comprising the steps of:
    growing a thin uniform silicon oxide coating over an entire surface of a monocrystalline silicon slice;
    covering the thin silicon oxide coating with a thin uniform layer of silicon nitride;
    removing the silicon nitride coating in a pattern to expose selected areas of the thin silicon oxide coating;
    implanting a first conductivity-type determining impurity into shallow surface-adjacent regions of the silicon in said selected areas by exposing the slice to an ion beam, such implanting being done through said thin silicon oxide coating;
    subjecting the slice to an elevated temperature of at least about 1000° C for at least about ½ hour in an inert atmosphere to reduce the damage to the crystalline structure of the silicon beneath said exposed selected areas caused by the ion beam and to raise the concentration of the first impurity in the silicon below said surface-adjacent regions;
    oxidizing the slice at a temperature below said elevated temperature for a time greatly exceeding that used in the prior step to create a thick silicon oxide coating in said exposed selected areas;
    removing the remaining silicon nitride from the surface of the slice; and
    forming MOS transistors and oxide-dielectric capacitors for said memory cells on said slice by diffusing or implanting into the slice second conductivity-type determining impurity of opposite type from the first impurity, the regions in the slice created by the first impurity being contiguous to that formed by the second impurity at least in the areas substantially surrounding the capacitors.

2. A method according to claim 1 wherein the step of subjecting the slice to an elevated temperature is maintained for a time in the range of one to two hours at a temperature of about 1000° C.

3. A method according to claim 2 wherein the inert atmosphere is nitrogen.

4. A method according to claim 1 wherein the silicon slice is predominantly of P-type of low impurity concentration, and the first impurity is boron.

5. A method according to claim 4 wherein the step of implanting produces a dosage of no more than about 4 × $10^{12}$ atoms of boron per square centimeter at an energy of about 100KeV.

6. A method according to claim 1 wherein the step of oxidizing the slice is of sufficient length in time to entirely consume said shallow surface-adjacent region produced by the step of implanting.

7. A method of processing a silicon slice in manufacture of integrated circuits, comprising:
    a. implanting conductivity-type determining impurity material in selected areas of a surface of the silicon slice through a thin silicon oxide coating;
    b. heating the slice in an inert atmosphere to a temperature of at least about 1000° C for at least about one-half hour to restore crystalline structure in the implanted surface and alter the concentration profile of said impurity material below the selected areas;
    c. thereafter oxidizing selected parts of said surface by heating the slice in an oxidizing atmosphere for a time much longer than one-half hour to at least partially consume the selected areas of silicon into which impurity was implanted and to grow a field oxide coating much thicker than said thin silicon oxide coating.

8. A method according to claim 7 wherein the first temperature is about 1000° C.

9. A method according to claim 8 wherein the first time period is in the range of 1 to 2 hours.

* * * * *